(12) United States Patent
Fukasawa et al.

(10) Patent No.: US 6,822,265 B2
(45) Date of Patent: Nov. 23, 2004

(54) LIGHT EMITTING DIODE (75) Inventors: Koichi Fukasawa, Yamanashi (JP); Hirohiko Ishii, Yamanashi (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 10/162,108

(22) Filed: Jun. 5, 2002

(65) Prior Publication Data
US 2002/0185646 A1 Dec. 12, 2002

(30) Foreign Application Priority Data

Jun. 6, 2001 (JP) .................................... P2001-170972

(51) Int. Cl.⁷ ............................................. H01L 27/15
(52) U.S. Cl. ........................ 257/81; 257/82; 257/432; 257/433; 257/723; 257/729; 257/773
(58) Field of Search .......................... 257/81, 82, 432, 257/433, 723, 724, 777

(56) References Cited

U.S. PATENT DOCUMENTS

| | | | | |
|---|---|---|---|---|
| 4,458,402 A | * | 7/1984 | Evans et al. ................. | 29/243 |
| 4,660,397 A | * | 4/1987 | Girimont ..................... | 70/456 |
| 4,980,568 A | * | 12/1990 | Merrick et al. ............. | 250/551 |
| 5,083,192 A | * | 1/1992 | Rzeznik et al. ............. | 357/74 |
| 5,112,672 A | * | 5/1992 | Kaule et al. ................. | 428/209 |
| 5,534,718 A | * | 7/1996 | Chang .......................... | 257/98 |
| 5,705,833 A | * | 1/1998 | Noguchi et al. ............. | 257/81 |
| 6,399,964 B1 | * | 6/2002 | Corr ............................. | 257/99 |
| 6,483,196 B1 | * | 11/2002 | Wojnarowski et al. ...... | 257/778 |

* cited by examiner

*Primary Examiner*—Long Pham
*Assistant Examiner*—Wai-Sing Louie
(74) *Attorney, Agent, or Firm*—Browdy and Neimark, P.L.L.C.

(57) ABSTRACT

A light emitting element is disclosed. When the light emitting diode is used as a backlight source for a liquid crystal display, the distance from the light emitting element 25 to the light receiving surface of the light guide plate 11 is reduced to increase the light spreading angle θ2 of the light introduced from the light emitting element 25 into the light guide plate 11 and also increase the amount of light entering the light guide plate 11, thus enhancing the level of brightness of the liquid crystal display. The light emitting diode comprises: a mother board 8 having an opening 9; a pair of electrodes 23, 24 arranged on one surface of the mother board 8; a light guide plate 11 arranged on the other surface of the mother board 8; a light emitting element 25 arranged in the opening 9 of the mother board 8 and mounted to one of the pair of electrodes 23, 24; and a positioning means 30 mounted on the one electrode to position the light emitting element 25 close to the light guide plate 11.

11 Claims, 8 Drawing Sheets

LIGHT EMITTING DIODE

BACKGROUND OF THE INVENTION

1. Field of the Invention

The present invention relates to a light emitting diode and more particularly to a chip type light emitting diode surface-mounted on a printed circuit board and the like.

2. Description of the Prior Art

Figure 1:
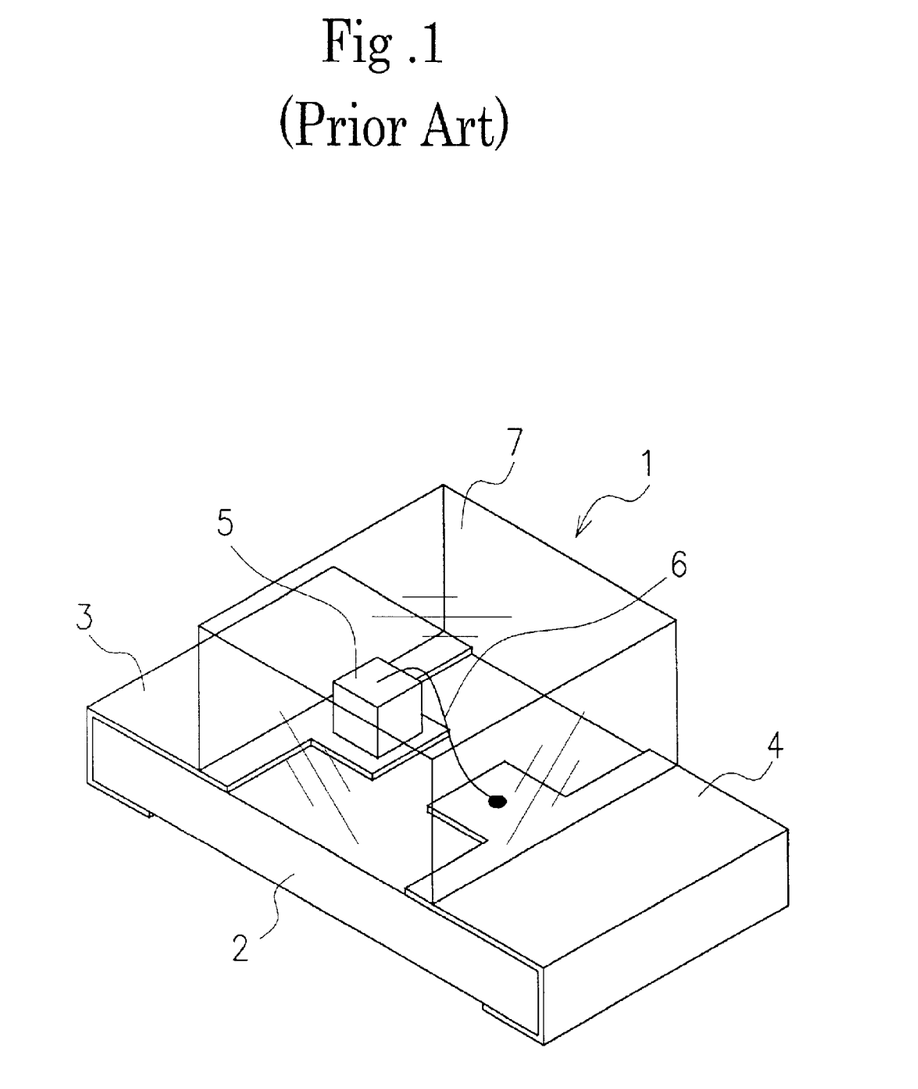
FIG. 1 is an overall perspective view of a conventional light emitting diode.

A chip type light emitting diode has a generally known construction such as shown in FIG. 1. This light emitting diode 1 comprises a base substrate 2 made from a rectangular glass epoxy plate, a first electrode 3 and a second electrode 4 separated from each other and provided at left and right sides of the base substrate 2 as by etching, a light emitting element 5 mounted on an upper surface of the first electrode 3, a bonding wire 6 connecting the light emitting element 5 and the second electrode 4, and a transparent resin sealing member 7 covering the bonding wire 6 and the light emitting element 5 from above.

Figure 2:
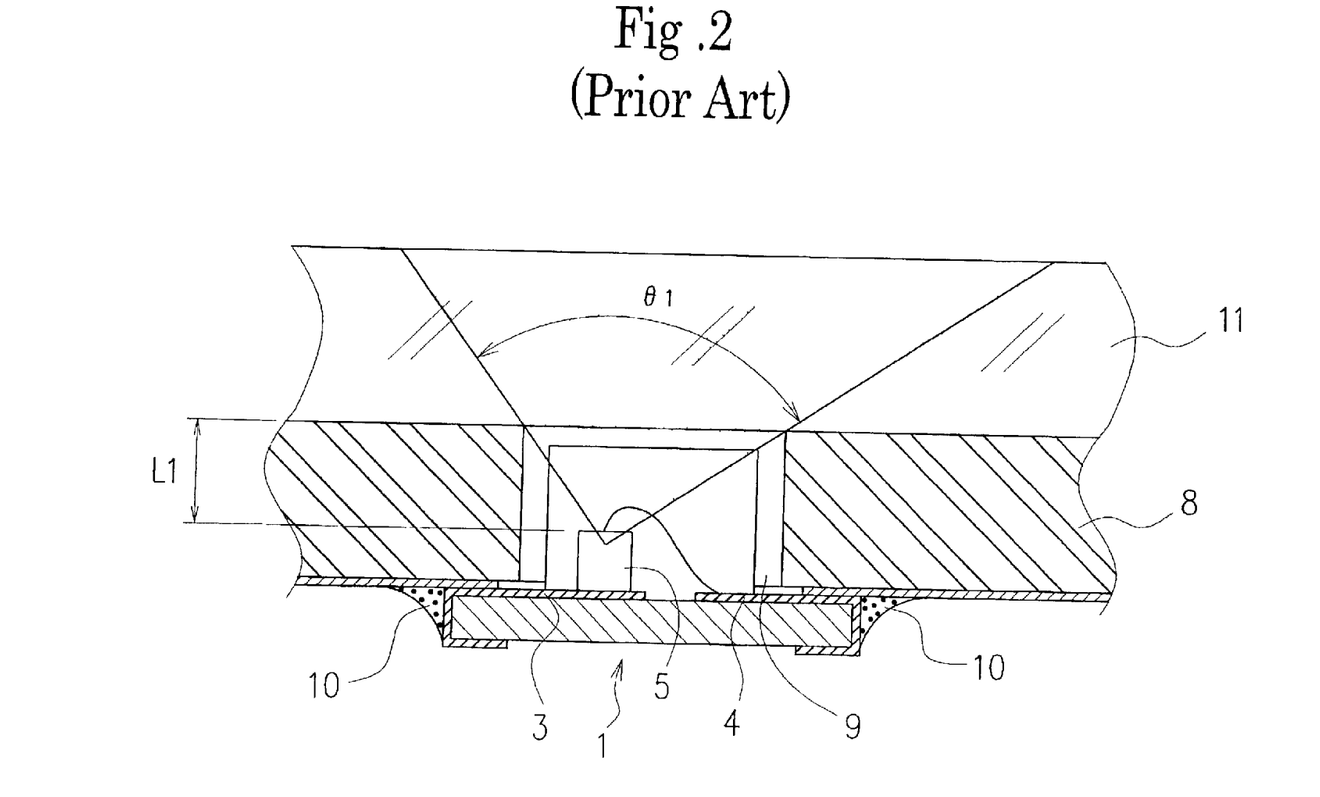
FIG. 2 is a cross-sectional view showing the conventional light emitting diode surface-mounted on a mother board.

The light emitting diode 1 of the above construction has found a wide range of applications in recent years, for example, as a backlight source in a liquid crystal display of cellular phones and small electronic devices. In this application an example use of the light emitting diode has a configuration that, as shown in FIG. 2, a mother board 8 for mounting the light emitting diode 1 is formed with an opening 9, and that a pair of left and right electrodes 3, 4 of the light emitting diode 1 are secured by solder 10 to peripheral portions on the back surface of the opening 9 so that light produced in the opening 9 is thrown into a light guide plate 11 mounted on the upper surface of the mother board 8, thereby illuminating the liquid crystal display from the back surface thereof.

In the conventional light emitting diode 1, however, since the light emitting element 5 is directly mounted on the upper surface of the first electrode 3, a distance L1 from the upper surface of the light emitting element 5 to a light receiving surface of the light guide plate 11 becomes large, which reduces a spreading angle θ1 of the incoming light introduced from the light emitting element 5 into the light guide plate 11. This in turn reduces the amount of light entering the light guide plate 11, making it difficult to increase a brightness of the liquid crystal display screen.

SUMMARY OF THE INVENTION

An object of the present invention is to provide a light emitting diode which, when used as a backlight source for a liquid crystal display, reduces a distance from a light emitting element to a light receiving surface of a light guide plate to increase the spreading angle of the light introduced from the light emitting element into the light guide plate and also increase the amount of light entering the light guide plate, thus enhancing the level of brightness of the liquid crystal display.

To achieve the above objective, the light emitting diode of the present invention comprises:

a mother board having an opening;

a pair of electrodes arranged on one surface of the mother board;

a light guide plate arranged on the other surface of the mother board;

a light emitting element arranged in the opening of the mother board and mounted to one of the pair of electrodes; and a positioning means mounted on the one electrode to position the light emitting element close to the light guide plate.

In this construction, since the light emitting element can be put close to the light guide plate by the positioning means provided on one of the electrodes, the light emitted from the light emitting element can be led out over a wide spreading angle although the light emitting element is installed in the opening of the mother board.

The pair of electrodes are attached to a substrate and an assembly of the electrodes and the substrate is secured to the mother board.

The positioning means has a spacer interposed between the one electrode and the light emitting element. This spacer has the simplest form of the positioning means.

Further, the positioning means is capable of adjusting the position of the light emitting element so as to change the position of the light emitting element relative to the light guide plate. Thus, adjusting the position of the light emitting element relative to the light guide plate can select a desired spreading angle of the light introduced from the light emitting element into the light guide plate.

Further, the positioning means comprises a plurality of replaceable spacers with different heights so that replacing the spacer with a desired one can change the position of the light emitting element relative to the light guide plate.

Further, the positioning means comprises a plurality of washers arranged between the light emitting element and the one electrode. By increasing or reducing the number of washers, the height of the positioning means can easily be adjusted.

Further, the positioning means comprises a screw member screwed into the substrate, and the screw member has a mounting portion on which to mount the light emitting element and a screw portion extending from the mounting portion. With this construction, the positioning means can easily change the position of the light emitting element relative to the light guide plate.

An electrical conduction is established between the one electrode and the spacer and between the spacer and the light emitting element.

The spacer is made from a conductive material. Thus, the electrical conduction between the one electrode and the light emitting element can easily be obtained through the spacer.

Further, the spacer is made from an insulating material. Thus, an insulation between the light emitting element and the one electrode can be secured by the spacer.

Further, the spacer has a reflection surface. This provides an increased level of brightness.

Further, the spacer comprises a core made of plastics or glass and a conductive metal plating provided on an outer surface of the core.

Further, the positioning means comprises a stepped portion formed by projecting a light emitting element mounting portion of the one electrode toward the light guide plate. This obviates the need for the spacer.

These features and advantages of the present invention will be described in more detail by referring to the accompanying drawings.

DESCRIPTION OF THE PREFERRED EMBODIMENTS

Embodiments of a light emitting diode according to the present invention will be described by referring to the accompanying drawings.

Figure 3:
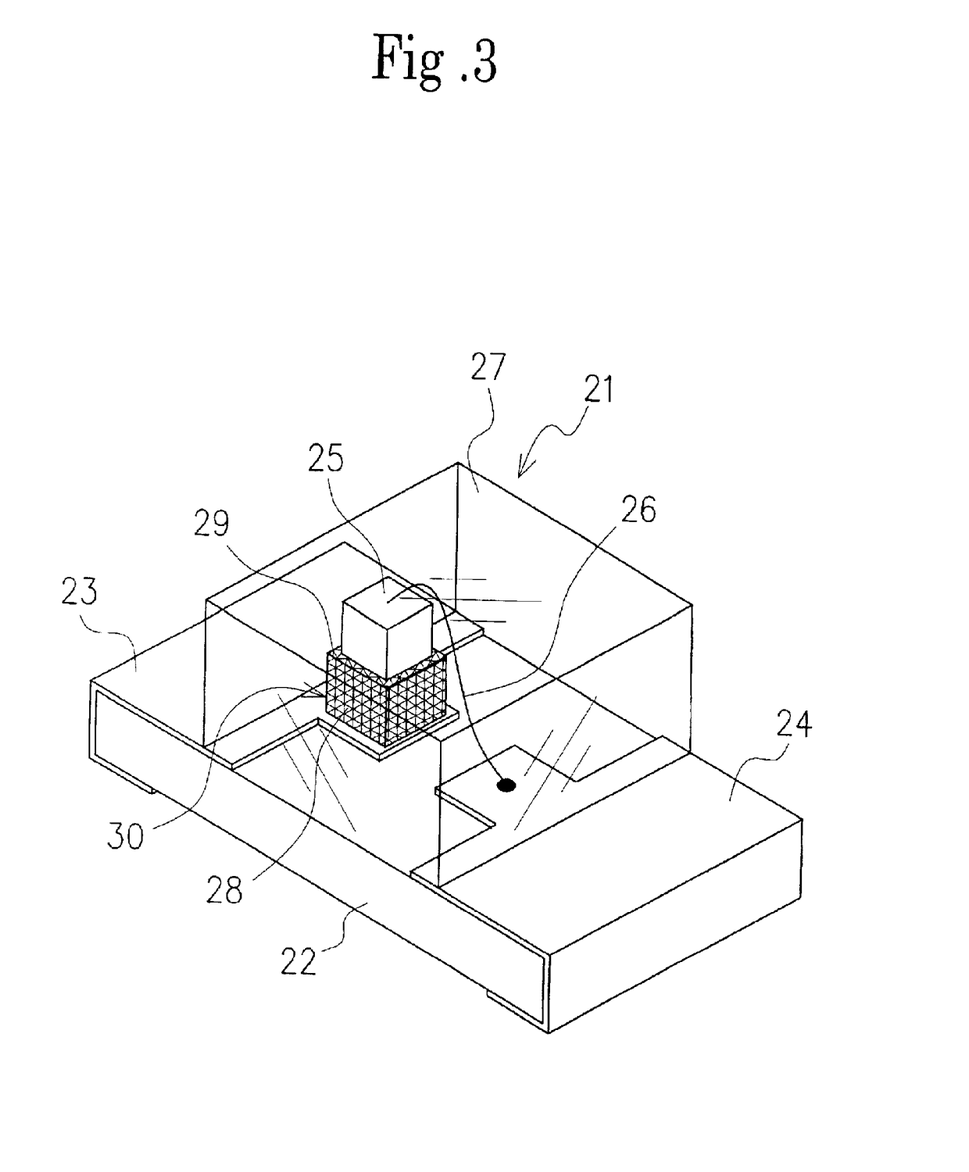
FIG. 3 is an overall perspective view of a light emitting diode according to the present invention.

FIG. 3 shows one embodiment of the light emitting diode according to the present invention. The light emitting diode 21 of this embodiment has basically the same construction as the conventional one described earlier, and comprises a base substrate 22 made from a rectangular glass epoxy plate, a first electrode 23 and a second electrode 24 separated from each other and provided at both sides of the base substrate 22 as by etching, a light emitting element 25 mounted on an upper surface of the first electrode 23 through a positioning means which will be described hereinafter, a bonding wire 26 connecting the light emitting element 25 and the second electrode 24, and a transparent resin sealing member 27 covering the bonding wire 26 and the light emitting element 25 from above. The first electrode 23 may be a cathode or an anode depending on the polarity of the light emitting element 25. The resin sealing member 27 may be made from an epoxy resin with a light transmission capability.

The first electrode 23 on which to mount the light emitting element 25 is provided with a positioning means 30 that puts the light emitting element 25 closer to the light guide plate 11. The positioning means 30 in this embodiment comprises a spacer 28 mounted on the upper surface of the first electrode 23. Thus, the light emitting element 25 is raised in vertical position by the height of the spacer 28.

In this embodiment, the spacer 28 is formed from a metal conductive material such as gold and silver alloys and shaped into a rectangular parallelepiped of a size slightly larger than the light emitting element 25, with a flat mounting surface 29 at the top. A bottom surface of the spacer 28 is fixed to the upper surface of the first electrode 23 with a conductive adhesive (not shown), and an underside electrode of the light emitting element 25 is fixed to the mounting surface 29 of the spacer 28 with a conductive adhesive (not shown). Therefore, a reliable electric conduction between the first electrode 23 and the light emitting element 25 is established through the spacer 28.

The height of the positioning means 30 or, in this embodiment, the spacer 28 can be adjusted according to the thickness of the mother board 8. This means that the position of the light emitting element 25 with respect to the light guide plate 11 can be changed.

The positioning means 30 with an adjustable height in this embodiment includes a plurality of replaceable spacers 28 with different heights. By replacing the spacer 28 with an appropriate one, the position of the light emitting element 25 relative to the light guide plate 11 can be changed.

Figure 5:
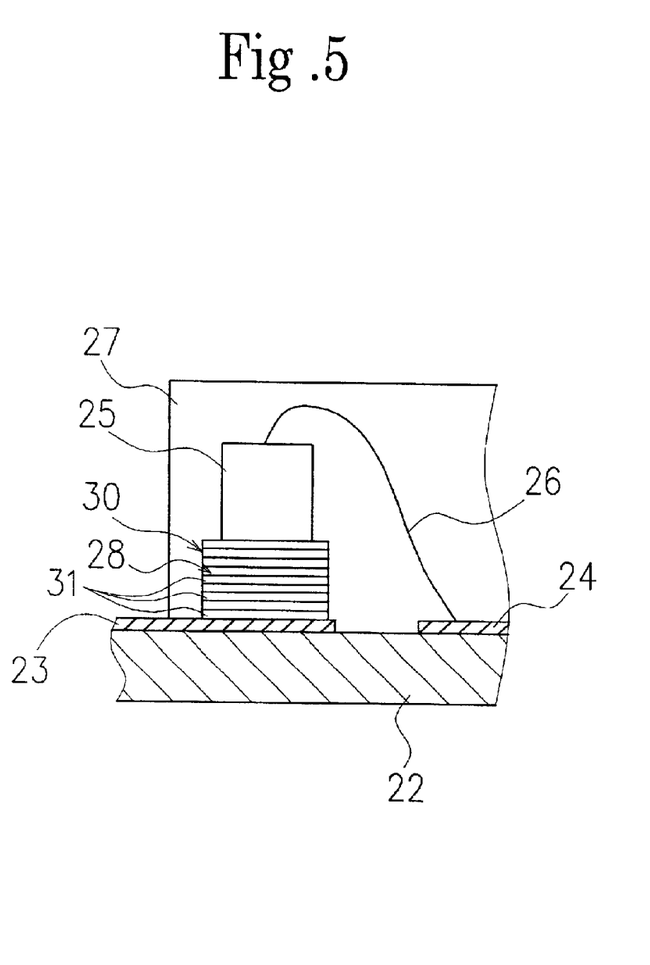
FIG. 5 is a partial cross-sectional view showing one embodiment of a positioning means for the light emitting diode of this invention.

FIG. 5 shows another embodiment of the positioning means 30. The positioning means 30 in this embodiment comprises a spacer 28 formed by stacking a plurality of washers 31 between the light emitting element 25 and the first electrode 23. In this embodiment, the position of the light emitting element 25 relative to the light guide plate 11 can be changed by increasing or reducing the number of washers 31.

Figure 6:
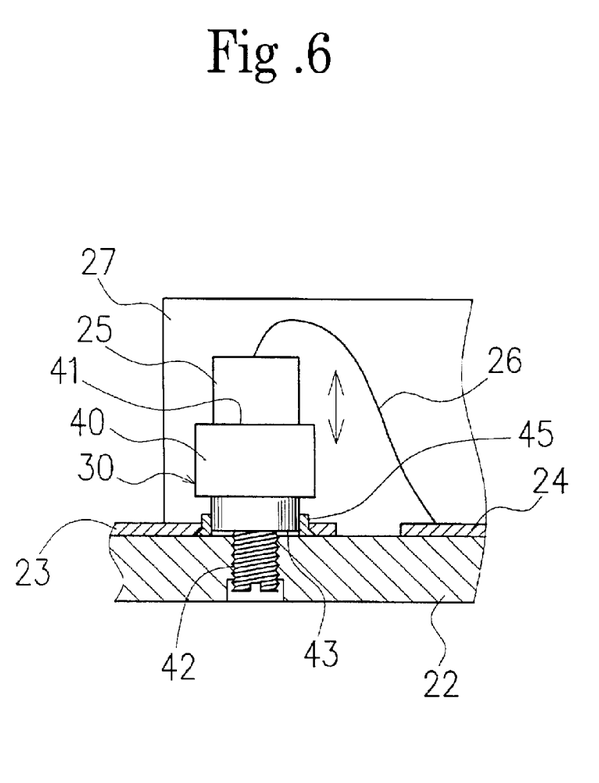
FIG. 6 is a partial cross-sectional view showing another embodiment of a positioning means for the light emitting diode of this invention.

FIG. 6 shows still another embodiment of the positioning means 30. The positioning means 30 in this embodiment comprises a screw member 40 screwed into the base substrate 22. The screw member 40 has a mounting portion 41 on which to mount the light emitting element 25 and a screw portion 42 extending from the mounting portion 41. Reference numeral 43 denotes a shaft portion extending from the mounting portion 41. The shaft portion 43 in the illustrated example fits smoothly in a boss 45 attached to the first electrode 23. Hence, rotating the screw portion 42 can move the light emitting element 25 in a direction of arrow (vertical direction). Further, the screw member 40 is electrically connected to the first electrode 23.

Figure 7:
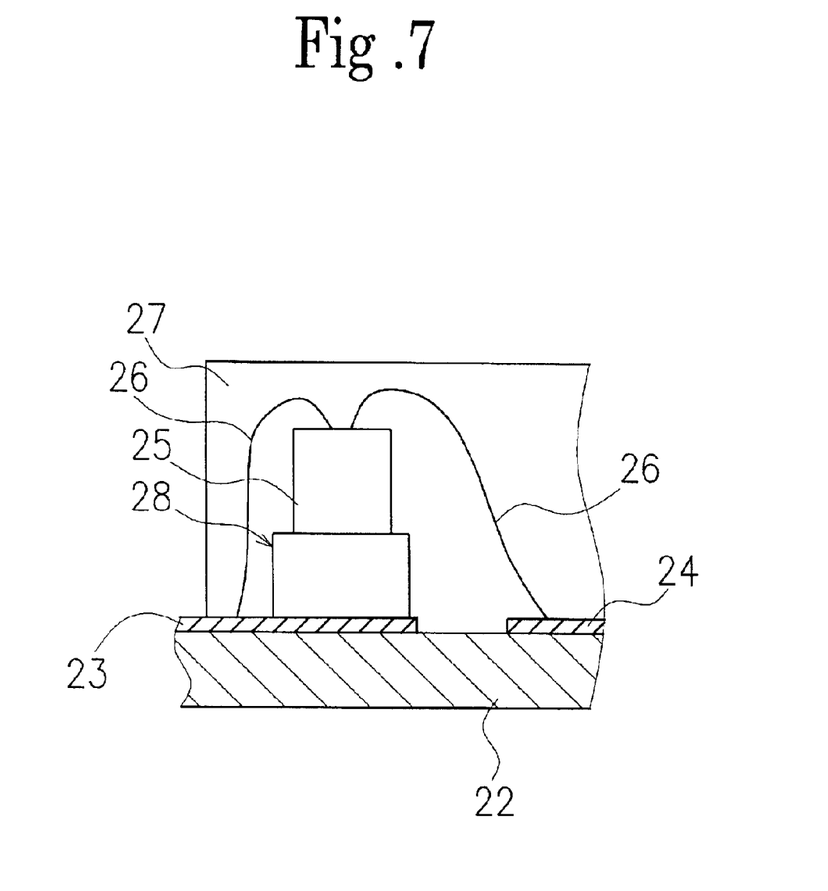
FIG. 7 is a partial cross-sectional view showing still another embodiment of a positioning means for the light emitting diode of this invention.

Rather than using the conductive material as described above, the spacer 28 may be formed of an insulating material, such as plastics and glass, plated with a conductive metal on its surface. Through this metal plating is established the electrical conduction between the first electrode 23 and the mounting portion 41 of the spacer 28. Further in this embodiment, the spacer 28 may be formed of only an insulating material such as plastics and glass without plating it with the conductive metal. This is suited for a construction in which a different type of light emitting element with no underside electrode is installed and in which an electrical connection between the light emitting element 25 and the first electrode 23 is made through a bonding wire 26', as shown in FIG. 7.

When the spacer 28 is formed from gold or silver alloys or is plated with a metal on its surface or coated with a white paint, the surface of the spacer 28 may be made a glossy reflection surface so that light from the light emitting element 25 can be reflected on the surface of the spacer 28, producing an increased level of brightness.

Figure 8:
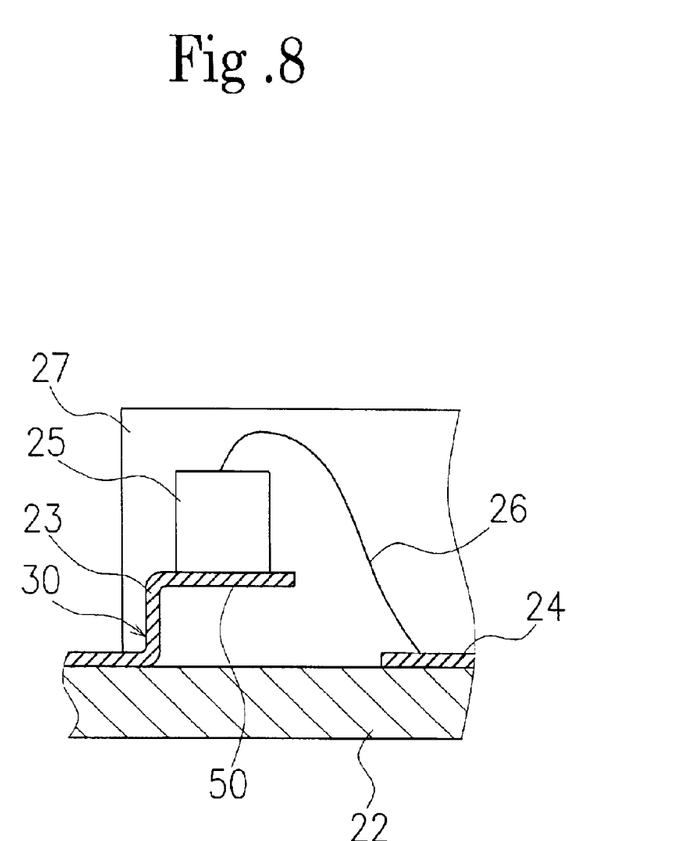
FIG. 8 is a partial cross-sectional view showing a further embodiment of a positioning means for the light emitting diode of this invention.

Further, as shown in FIG. 8, the positioning means 30 may be constructed of a stepped portion 50 of the first electrode 23 which is formed by projecting the mounting portion for the light emitting element 25 toward the light guide plate 11. In this construction the spacer 28 is not needed.

Figure 4:
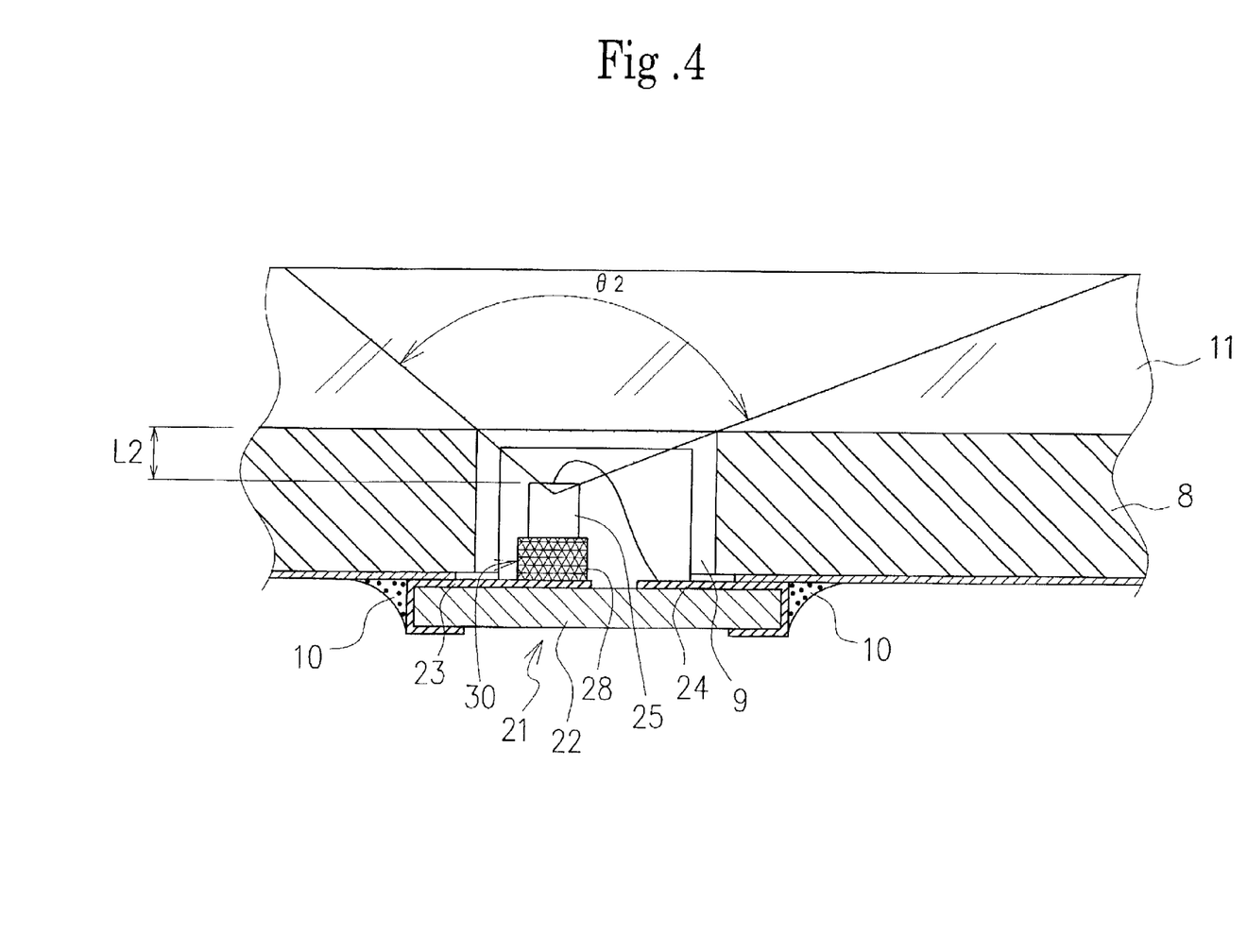
FIG. 4 is a cross-sectional view showing the light emitting diode of FIG. 3 surface-mounted on a mother board.

FIG. 4 shows a mounting means when the light emitting diode 21 of the above construction is used as a backlight source for a liquid crystal display of cellular phones and small electronic devices. The light emitting diode 21 is surface-mounted on the mother board 8 in basically the same manner as in the conventional example described above and the identical parts are assigned like reference numerals in the following description. As in the conventional example, the mother board 8 is formed with an opening 9, around the underside periphery of which a pair of left and right electrodes 23, 24 are fixed with solder 10. The light emitting diode 21 mounted on the mother board in this manner emits light in the opening 9 and the light thus produced enters and illuminates the light guide plate 11 mounted on the upper surface of the mother board 8.

In the light emitting diode 21 of this invention, since the light emitting element 25 is mounted on the mounting surface 29 of the spacer 28, a distance L2 from the upper surface of the light emitting element 25 to a light receiving surface of the light guide plate 11 becomes very small compared with that of the conventional light emitting diode. That is, because the light emitting element 25 emits light at a higher position in the opening 9, the amount of light that is introduced from the light emitting element 25 through the opening 9 of the mother board 8 into the light guide plate 11 increases and a spreading angle θ2 of the incoming light widens, thus illuminating the liquid crystal display screen with an increased level of brightness.

As described above, in the light emitting diode of this invention, since the positioning means for placing the light emitting element close to the light guide plate is provided on the electrode, i.e., since the spacer is interposed between the electrode and the light emitting element, it is possible to set the illuminating position of the light emitting element high and thereby introduce the light emitted from the light emitting element into the light guide plate over a wider light spreading angle.

Therefore, where the light emitting diode of this invention is surface-mounted on the mother board to function as a backlight source for a liquid crystal display of cellular phones and small electronic devices, since the amount of light introduced from the light emitting element into the light guide plate is increased and at the same time the spreading angle over which the light enters the light guide plate 11 is also widened, the liquid crystal display screen can be illuminated at a higher level of brightness.

It should be noted that the present invention is not limited to the embodiments above and that various modifications and changes may be made without departing from the spirit of the invention.

What is claimed is:

1. A light emitting diode comprising:
    a mother board having upper and lower surfaces and an opening extending through said board and through said upper and lower surfaces;
    an assembly including a substrate fixed on said lower surface of said mother board and a pair of electrodes provided on said substrate;
    a light guide plate arranged on said upper surface of the mother board;
    a light emitting element arranged in said opening of said mother board at a distance from said light guide plate and attached to one electrode of said pair of electrodes; and
    a positioning means arranged between said one electrode and said light emitting element to position said light emitting element relative to said light guide plate,
    wherein
    said light guide plate is disposed to receive light emitted by said light emitting element to guide the light into and through said light guide plate, and
    said positioning means is constructed to cause the distance of the light emitting element from the light guide plate to have a value that is adjustable over a range in order to change an incident angle of light from the light emitting element into the light guide plate.

2. The light emitting diode according to claim 1, wherein the positioning means has a spacer interposed between the one electrode and the light emitting element.

3. The light emitting diode according to claim 1, wherein the positioning means comprises a plurality of spacers, each said spacer being replaceable and having a respectively different height.

4. The light emitting diode according to claim 1, wherein the positioning means comprises a plurality of washers disposed between the light emitting element and the one electrode.

5. The light emitting diode according to claim 1, wherein the positioning means comprises a screw member screwed into the substrate, and the screw member has a mounting portion on which to mount the light emitting element and a screw portion extending from the mounting portion.

6. The light emitting diode according to claim 2, wherein an electrical conduction is established between the one electrode and the spacer and between the spacer and the light emitting element.

7. The light emitting diode according to claim 2, wherein the spacer is made of a conductive material.

8. The light emitting diode according to claim 2, wherein the spacer is made of an insulating material.

9. The light emitting diode according to claim 2, wherein the spacer has a reflection surface.

10. The light emitting diode according to claim 2, wherein the spacer comprises core made of plastic or glass and a conductive metal plating provided on an outer surface of the core.

11. The light emitting diode according to claim 1, wherein said assembly further comprises a resin sealing member covering the light emitting element from above.

* * * * *